United States Patent [19]
Yonehara

[11] Patent Number: 5,463,975
[45] Date of Patent: Nov. 7, 1995

[54] PROCESS FOR PRODUCING CRYSTAL

[75] Inventor: Takao Yonehara, Atsugi, Japan

[73] Assignee: Canon Kabushiki Kaisha, Tokyo, Japan

[21] Appl. No.: 90,626

[22] Filed: Jul. 12, 1993

Related U.S. Application Data

[63] Continuation of Ser. No. 742,483, Aug. 5, 1991, abandoned, which is a continuation of Ser. No. 598,821, Oct. 17, 1990, abandoned, which is a continuation of Ser. No. 162,259, Feb. 29, 1988, abandoned.

[30] Foreign Application Priority Data

Mar. 2, 1987 [JP] Japan .................................. 62-47033

[51] Int. Cl.$^6$ .................................................. C30B 1/08
[52] U.S. Cl. .................... 117/9; 117/10; 117/43; 117/44; 117/89
[58] Field of Search ..................... 156/610, 611, 156/613, 614, 626.72, DIG. 64, DIG. 72, DIG. 73, DIG. 80; 437/241; 148/DIG. 4; 427/255.1, 255.2, 255.3; 117/9, 10, 43, 44, 89, 930, 935

[56] References Cited

U.S. PATENT DOCUMENTS

| | | | |
|---|---|---|---|
| 3,239,372 | 3/1966 | Sirtl | 156/613 |
| 3,620,833 | 11/1971 | Gleim et al. | 156/614 |
| 4,059,461 | 11/1977 | Fan et al. | 156/DIG. 88 |
| 4,180,618 | 12/1979 | Alpha et al. | 156/DIG. 64 |
| 4,346,513 | 8/1982 | Nishizawa et al. | 156/613 |
| 4,522,662 | 6/1985 | Bradbury et al. | 156/613 |
| 4,522,680 | 6/1985 | Ogawa | 156/620.72 |
| 4,585,512 | 4/1986 | Hayafugi et al. | 156/620.72 |
| 4,592,792 | 6/1986 | Corboy et al. | 156/613 |
| 4,637,127 | 1/1987 | Kurogi et al. | 156/614 |

FOREIGN PATENT DOCUMENTS

| | | | |
|---|---|---|---|
| 0240309 | 10/1987 | European Pat. Off. | 156/610 |
| 60-145629 | 8/1985 | Japan | 148/DIG. 4 |
| 0224282 | 11/1985 | Japan | 156/610 |

OTHER PUBLICATIONS

Claassen et al, "The Nucleation of CVD Silicon on $SiO_2$ and $SiN_4$ Substrates" Journal of Electrochemical Society: Solid State Science and Technology, Jan. 1980 pp. 194–202.
Narayan et al, "Laser-Solid Interactions and Transient Thermal Processing of Materials", North-Holland, New York, 1983 pp. 581–592.
Jastrzebski, "SOI by CVD: Epitaxial Lateral Overgrowth (ELO) Process" Journal of Crystal Growth, vol. 63 (1983) pp. 493–526.
Jastrzebski et al., "Growth Process of Silicon Over $SiO_2$ by CVD" Journal of Electrochemical Society: Solid State Technology, vol. 130 No. 7 pp. 1571–1580.
Elec. Lett., vol. 15, No. 25 (1979) 827:8.
Thin Sol. Films, vol. 113, No. 4 (1984) 337:35.
Sov. Phys. Tech. Phys., vol. 29, No. 7 (1984) 822:3.
Brit. J. App. Phys., vol. 18, No. 10 (1967) 1357:82.
Thin Sol. Films, vol. 124, No. 1 (1985) 3:10.

*Primary Examiner*—Robert Kunemund
*Attorney, Agent, or Firm*—Fitzpatrick, Cella, Harper & Scinto

[57] ABSTRACT

A process for producing a crystal comprises the step of applying crystal forming treatment on a light-transmissive substrate having a non-nucleation surface ($S_{NDS}$) of a small nucleation density and a nucleation surface ($S_{NDL}$) of a nucleation density ($ND_L$) greater than the nucleation density ($N_{DS}$) of said non-nucleation surface ($S_{NDS}$) and formed of an amorphous material ($M_L$) different from the material ($M_S$) forming the non-nucleation surface ($S_{NDS}$) at a small area sufficient to effect crystal growth from only a single nucleus to form a single crystal nucleus on the nucleation surface ($S_{NDL}$), thereby growing a single crystal from the single nucleus, and the step of reducing the crystal defects of the crystal in the vicinity of the interface with the substrate by irradiation of light from the side of the substrate.

10 Claims, 6 Drawing Sheets

Fig. I(A)
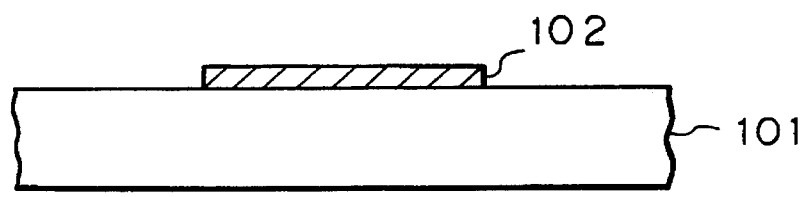
Fig. I(B)
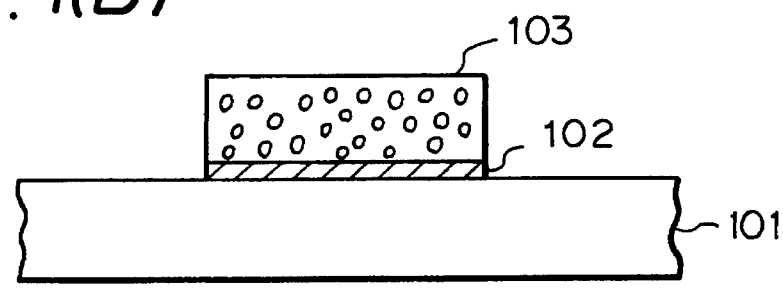
Fig. 6
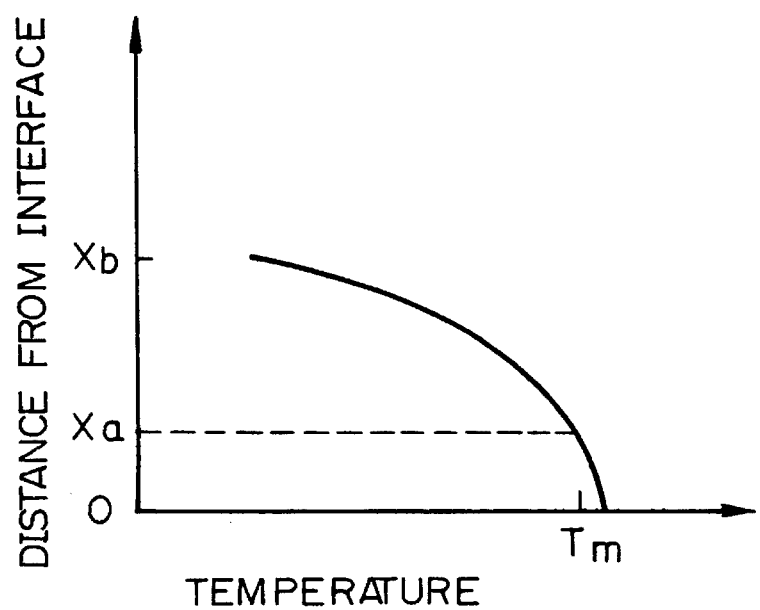

PROCESS FOR PRODUCING CRYSTAL

This application is a continuation of application Ser. No. 07/742,483, filed Aug. 5, 1991, now abandoned which, in turn, is a continuation of application Ser. No. 07/598,821, filed Oct. 17, 1990, now abandoned which in turn, is a continuation of application Ser. No. 07/162,259, filed Feb. 29, 1988, now abandoned.

BACKGROUND OF THE INVENTION

1. Field of the Invention

This invention relates to a process for producing a crystal, particularly to a process for producing a crystal to be formed on a light-transmissive substrate.

2. Related Background Art

In the prior art, single crystalline thin films to be used for semiconductor electronic devices, optical devices, etc. have been formed by epitaxial growth on a single crystalline substrate. However, for epitaxial growth of a single crystalline thin film on a single crystalline substrate, it is necessary to take matching in lattice constant and coefficient of thermal expansion between the single crystalline material of the substrate and the epitaxial growth layer, and there has been involved the problem that the kinds of the substrate material were limited to extremely narrow scope for formation of a single crystalline layer capable of being used to prepare a device of good quality.

On the other hand, in recent years, research and development have been actively done about three-dimensional integrated circuits for accomplishing high integration and multi-functionality by forming semiconductor elements by lamination in the direction normal to the substrate, and also research and development about large area semiconductor devices such as solar batteries or switching transistors for liquid crystal picture elements, etc. in which elements are arranged in an array on an inexpensive glass plate are becoming more active year by year.

What is common in these researches and developments, the technique to form a semiconductor film on an amorphous insulating material and form an electronic element such as a transistor, etc. thereon is required. Among them, it has been particularly desired to have a technique to form a single crystalline semiconductor of high quality on an amorphous insulating material.

However, generally speaking, when a thin film is formed on an amorphous insulating substrate such as $SiO_2$, etc., due to deficiency of long length order of the substrate material, the crystal structure of the deposited film becomes amorphous or polycrystalline, whereby it was very difficult to form a single crystalline semiconductor of high quality. Here, the term "amorphous" refers to the state in which short length order to the minimum extent on the order of atom may be maintained, but there is no long length order, while the term "polycrystalline" refers to the state in which single crystal grains having no specific crystal direction are gathered while being separated with grain boundaries.

As a solution of the problems as mentioned above in the prior art, the present inventor has proposed in Japanese Patent Application No. 153273/1986 a method for forming a crystal, which comprises adding on a substrate having a non-nucleation surface ($S_{NDS}$) of a small nucleation density at a small area sufficient to effect crystal growth from only a single nucleus at a desired position of the non-nucleation surface ($S_{NDS}$) an amorphous material ($M_L$) for forming a nucleation surface ($S_{NDL}$) having a nucleation density ($ND_L$) greater than the nucleation density ($ND_S$) of the non-nucleation surface ($S_{NDS}$), the amorphous material ($M_L$) being different from the material ($M_S$) constituting the non-nucleation surface ($S_{NDS}$), to form the nucleation surface ($S_{NDL}$), and then applying crystal forming treatment on the substrate to form a single crystal nucleus on the nucleation surface ($S_{NDL}$), thereby growing a single crystal from the single nucleus. This crystal forming method shows that it is possible to form a single crystal on the surface of a substrate having a surface made of an insulating amorphous material.

The present inventor has intensively studied about the above method for forming a crystal and the crystal formed thereby, and consequently found by way of various crystal analytical methods that although good crystal can be formed at the upper part of the crystal to be formed, but there is a case where crystal defects occur at the interface between the amorphous surface and the crystal formed. These crystal defects will become the cause for leak current or trap in formation of electronic devices, thus affecting electrical characteristics thereof.

SUMMARY OF THE INVENTION

An object of the present invention is to form a crystal having good crystallinity by reducing the crystal defects clustered in the vicinity of the interface between the substrate and the crystal as mentioned above.

According to the present invention, there is provided a process for producing a crystal, which comprises the step of applying crystal forming treatment on a light-transmissive substrate having a non-nucleation surface ($S_{NDS}$) of a small nucleation density and a nucleation surface ($S_{NDL}$) having a nucleation density ($ND_L$) greater than the nucleation density ($ND_S$) of the non-nucleation surface ($S_{NDS}$) and formed of an amorphous material ($M_L$) different from the material ($M_S$) forming the non-nucleation surface ($S_{NDS}$) at a small area sufficient to effect crystal growth from only a single nucleus to form a single crystal nucleus on the nucleation surface ($S_{NDL}$), thereby growing a single crystal from the single nucleus, and the step of reducing the crystal defects of the crystal in the vicinity of the interface with the substrate by irradiation of light from the side of the substrate.

BRIEF DESCRIPTION OF THE DRAWINGS

FIGS. 1(A) and 1(B) illustrate the selective deposition method.

FIG. 6 is a graph showing the temperature distribution versus the distance from the interface during light irradiation (during annealing).

DESCRIPTION OF THE PREFERRED EMBODIMENTS

Figure 2:
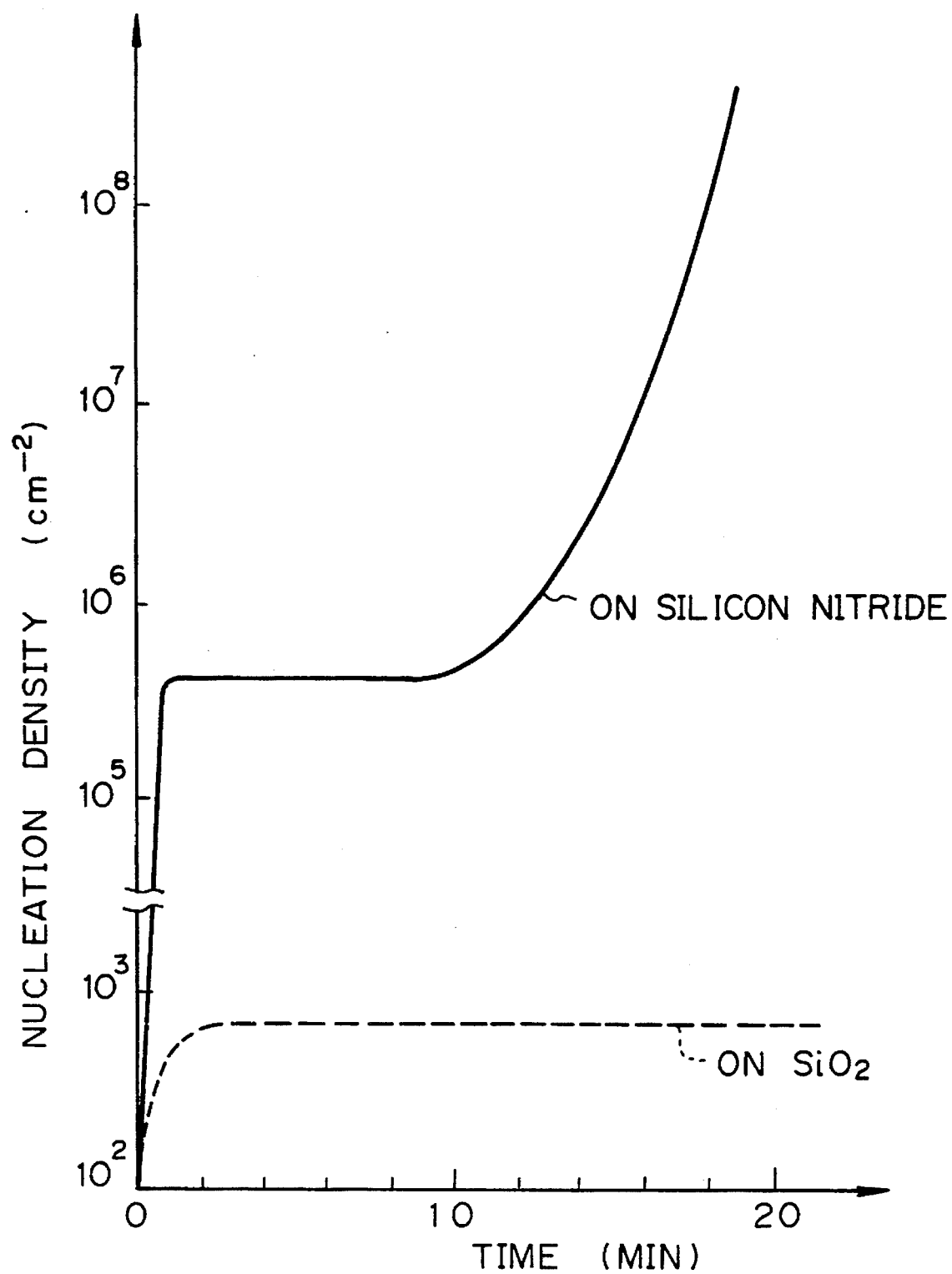
FIG. 2 is a graph showing the changes in nucleation density with lapse of time on the deposition surface of $SiO_2$ and the deposition surface of silicon nitride.

The present invention is intended to provide on a light-transmissive substrate a nucleation surface ($S_{NDL}$) composed of a material different from the material constituting the surface ($S_{NDS}$) of the light-transimissive substrate which is sufficiently greater in nucleation density than the material constituting the surface ($S_{NDS}$) at an area which is sufficiently fine such that only a single nucleus can grow, to grow a crystal by use of the single nucleus grown on the nucleation surface ($S_{NDL}$) as a center, and to effect, during or after the growing step, light irradiation in the vicinity of the interface between the light-transmissive substrate and the crystal, thereby melting partially the crystal to reduce the crystal defects of the crystal formed.

The embodiments of the present invention are described in detail below by referring to the drawings.

Prior to description of the present invention, the crystal growth method shown in Japanese Patent Application No. 153273/1986 is to be explained.

First, for better understanding of the above crystal growth method, description is made about the selective deposition method for forming selectively a deposited film on the deposition surface.

The selective deposition method is a method in which a thin film is formed selectively on the substrate by utilizing the difference between the materials in factors influencing nucleus formation in the thin film forming process such as surface energy, attachment coefficient, release coefficient, surface diffusion speed, etc.

FIGS. 1(A) and 1(B) are illustrations of the selective deposition method. First, as shown in FIG. 1(A), on the substrate 101, a thin film 102 comprising a material different in the above factors from the substrate 101 is formed at a desired portion. And, when deposition of a thin film comprising an appropriate material is effected under appropriate deposition conditions, the thin film 103 grows only on the thin film 102, whereby it is possible to give rise to a phenomenon that no growth occurs on the substrate 101. By utilizing this phenomenon, the thin film 103 formed self-matchingly can be grown, whereby it becomes possible to omit the lithographic step by use of a resist as practiced in the prior art.

As the material for enabling deposition according to such selective formation method, for example, $SiO_2$ may be used as the substrate 101, Si, GaAs, silicon nitride as the thin film 102 and Si, W, GaAs, InP, etc., as the thin film 103 to be deposited.

FIG. 2 is a graph showing the change with lapse of time of nucleation density (ND) on the deposited surface of $SiO_2$ and the deposited surface of silicon nitride.

As shown in the same graph, soon after initiation of deposition, the nucleation density (ND) on $SiO_2$ is saturated at $10^3$ cm$^{-2}$ or less, and the value is not substantially changed even after 20 minutes.

In contrast, on silicon nitride ($Si_3N_4$), it is once saturated at about $4 \times 10^5$ cm$^{-2}$ is not substantially changed 10 minutes thereafter, but is abruptly increased thereafter. This measurement example shows the case in which $SiCl_4$ gas is diluted with $H_2$ and deposited according to the CVD method under the conditions of a pressure of 175 Torr and a temperature of 1000° C. Otherwise, the same action can be obtained by use of $SiH_4$, $SiH_2Cl_2$, $SiHCl_3$, $SiF_4$, etc., as the reaction gas, and controlling the pressure, temperature, etc. Also, the vacuum vapor deposition can be employed.

In this case, nucleation on $SiO_2$ poses substantially no problem, but by addition of HCl gas into the reaction gas, nucleation on $SiO_2$ can be further suppressed to make deposition of Si on $SiO_2$ perfectly zero.

Such a phenomenon depends greatly on the difference in adsorption coefficient, release coefficient, surface diffusion coefficient, etc., relative to Si of the material surfaces of $SiO_2$ and silicon nitride, but the fact that $SiO_2$ itself is etched by the reaction of $SiO_2$ with Si atom itself to form silicon monooxide with higher vapor pressure, while no such etching phenomenon occurs on silicon nitride may be also considered to be the cause to effect selective deposition (T. Yonehara, S. Yoshioka, S. Miyazawa, Journal of Applied physics 53, 6839, 1982).

Thus, by selecting $SiO_2$ and silicon nitride as the materials of the deposition surface and silicon as the material to be deposited, sufficiently great nucleation density difference ($\Delta ND$) as shown in the same graph can be obtained. Here, although $SiO_2$ is desirable as the material for the deposition surface, this is not limitative and sufficient nucleation density difference can be obtained even by use of $SiO_x$ ($0<x<2$).

Of course, the present invention is not limited to these materials, but the difference in nucleation density ($\Delta ND$) may be sufficiently $10^2$-fold or more in density of nuclei as shown by the same graph, and sufficient selective formation of a deposited film can be done with the materials as exemplified below.

As another method for obtaining this nucleation density difference ($\Delta ND$), ions of Si or N may be implanted locally into the $SiO_2$ surface to form a region having excessive Si or N.

Japanese Patent Application No. 153273/1986 as mentioned above utilizes such selective deposition method based on the nucleation density difference ($\Delta ND$) and, by forming on a first deposition surface a second deposition surface (nucleation surface) having sufficiently greater nucleation density than the material constituting the first deposition surface and formed of a material different from the material constituting the first deposition surface sufficiently finely so that a crystal may grow from only a single nucleus, a single crystal can be grown selectively from the site where the nucleation surface made of such fine different kind of material exists.

In this connection, since selective growth of a single crystal is determined depending on the electron state of the deposition surface, particularly the state of dangling bonds, the material of a lower nucleation density (for example, $SiO_2$) is not required to be a bulk material, but it may be formed only on the surface of any desired material, substrate, etc., to form the above deposition surface.

Figure 3A:
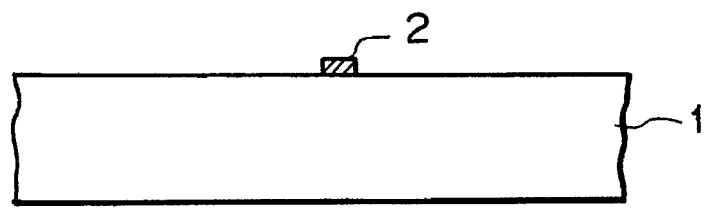
FIGS. 3(A)–3(D) are diagrams of the formation steps showing an example of the process for forming a single crystal.
Figure 3B:
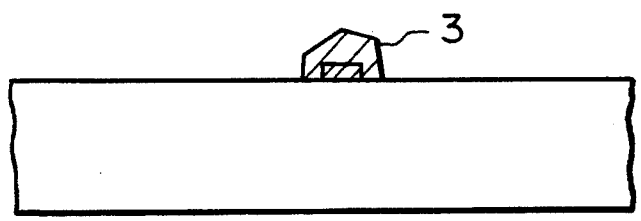
Figure 3C:
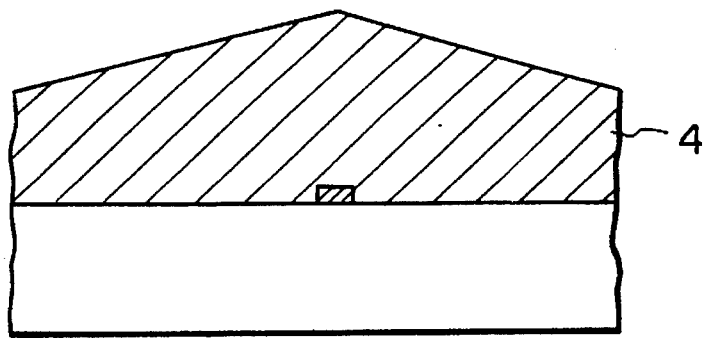
Figure 3D:
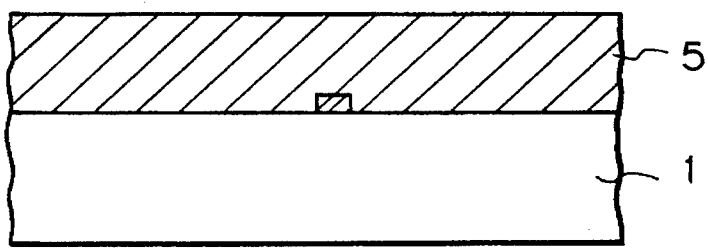
Figure 4:
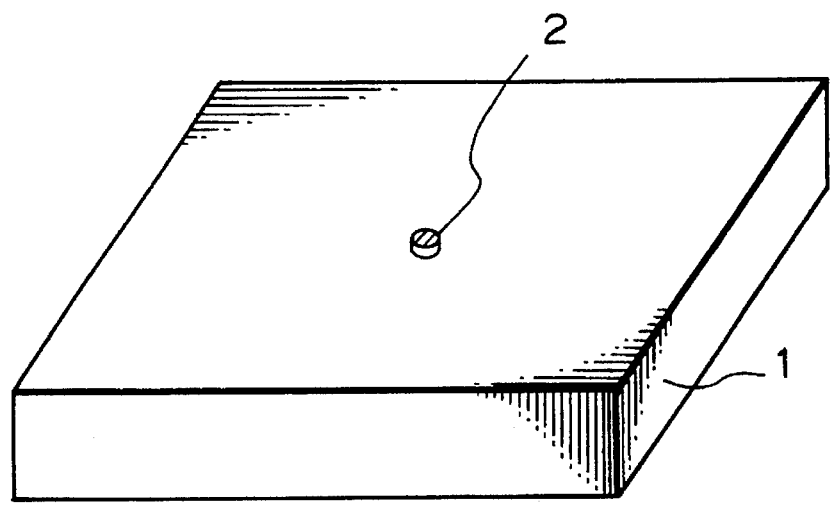
FIGS. 4(A) and 4(B) are perspective views of the substrate in FIGS. 3(A) and 3(D).
Figure 4:
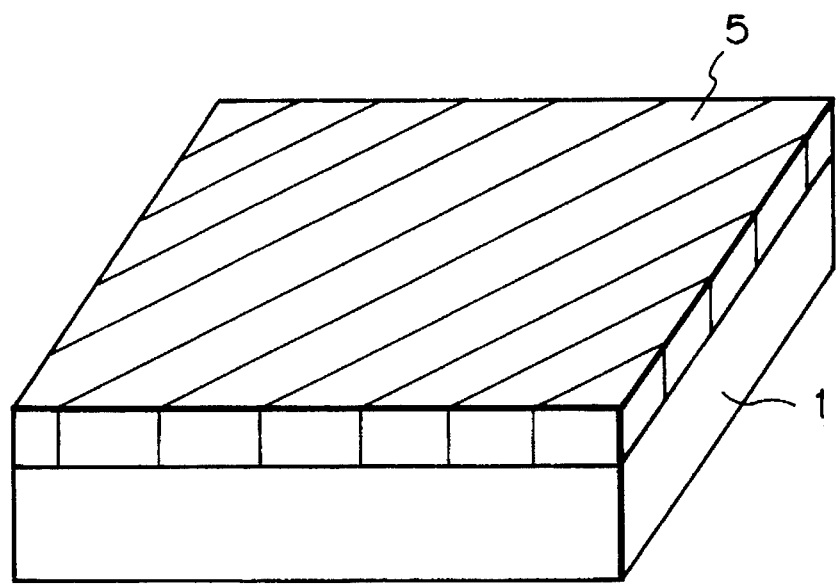

FIGS. 3(A) through 3(D) show diagramatically the steps of an example of the process for forming a single crystal disclosed in Japanese Patent Application No. 153273/1986, and FIGS. 4(A) and 4(B) are perspective views in FIGS. 3(A) and 3(D).

First, as shown in FIG. 3(A) and FIG. 4(A), on a substrate 1 having a small nucleation density is deposited thinly a material of a different kind having a large nucleation density, and patterning is effected by lithography, etc. to form a nucleation surface ($S_{NDL}$) 2 formed of the thin film of the material of different kind sufficiently finely. As described above, the nucleation surface 2 is inclusive of modified regions containing excessively Si, N, etc. formed by ion implantation of Si, N, etc. into the substrate 1.

Next, by selection of appropriate deposition conditions, a single nucleus of a thin film material is formed only on the nucleation surface 2. That is, the nucleation surface 2 formed of the thin film of a different kind material is required to be formed sufficiently finely so that only a single nucleus may be formed thereon. The size of the nucleation surface 2, which may differ depending on the kind of the material, may be several microns or less. Further, the nucleus grows while maintaining the single crystal structure to become a single crystal grain 3 in shape of an island as shown in FIG. 3(B). For forming an island-shaped single crystal grain 3, it is desirable to determine the conditions so that no nucleation may occur at all on the substrate 1, as already mentioned.

The island-shaped single crystal grain 3, further grows while maintaining the single crystal structure with the nucleation surface 2 as the center, whereby it can cover over the whole substrate 1 as shown in FIG. 3(C).

Subsequently, the single crystal 4 is flattened by etching or polishing, and a single crystal layer 5 capable of forming a desired element can be formed on the substrate 1 as shown in FIG. 3(D) and FIG. 4(B).

The single crystal layer 5 thus formed will frequently have crystal defects generated from the interface with the nucleation surface or the non-nucleation surface. Such crystal defects may be considered to be attributable to surface defects, coarsening, etc. of the deposition surface, and exert deleterious influences on various electrical characteristics by leak current, trap, etc. in preparation of an electronic device.

The present invention is intended to grow a crystal on a light-transmissive substrate by use of the crystal formation method as described above and reduce the crystal defects by melting partially the crystal at the interface with the substrate by heating the vicinity of the interface with a photo-energy beam such as a laser, a lamp, etc. through the light-transmissive substrate. By selecting the wavelength output of the light source, light absorption, light transmittance of the substrate and the light absorption, the depth of the crystal can be controlled.

In the following, description is made about the case when an Si single crystal is grown on a light-transmissive substrate as an embodiment of the present invention. The steps up to the step of growing an Si single crystal on the light-transmissive substrate are the same as those shown in FIGS. 3(A)–3(C), and therefore they are described by referring to FIG. 3(A)–3(C).

As the substrate 1 shown in FIG. 3(A)–3(D), a material which is transmissive of light and lower in nucleation density for Si, such as glass, quartz, etc. is used, As the nucleation surface made of the fine material of different kind, a material having higher nucleation density for Si, such as silicon nitride, Si with $N^+$ ions being locally ion implanted on $SiO_2$ surface, SiO containing excessive N, etc. may be employed, As shown in FIG. 3(B), when Si atoms are supplied onto the substrate by CVD (chemical vapor deposition), MBE (ultra-high vacuum deposition), etc., the Si atoms will effect nucleation on the nucleation surface 2 formed of the material of a different kind having a higher attachment coefficient, by passing through the steps at the initial stage of thin film formation such as surface diffusion, agglomeration, revaporization, etc. on the substrate. Since the nucleation surface 2 is formed very minutely (which may be 4 μm or less), only a single nucleus can grow and no growth of a plurality of nuclei can be permitted, whereby the single crystal grain 3 of Si continues to grow with the single nucleus which is a single crystal as the center. Generally speaking, a stable nucleus which continues stable growth without revaporization is said to be some 10 Å, but by selecting the conditions which will permit no nucleation on the material of the substrate 1 at all, a single crystal 4 can be formed by permitting the Si single crystal grain 3 to grow to 100 μm or greater as shown in FIG. 3(C).

The growth condition may be, for example, chemical decomposition of $SiH_xCl_{4-x}$ gas or $Si_xH_{2(1+x)}$ in $H_2$ reducing atmosphere at 700° to 1200° C.

The single crystal 4 of Si thus grown by the process for the present invention was examined in detail for its crystallinity by use of transmission electron microscope, X-ray diffraction, defect visualizing chemical etchant, etc. As the result, it has been found that crystal defects such as stacking fault, twin boundary, dislocation, etc. occur from the interface between the single crystal of Si 4 and the substrate 1.

Figure 5A:
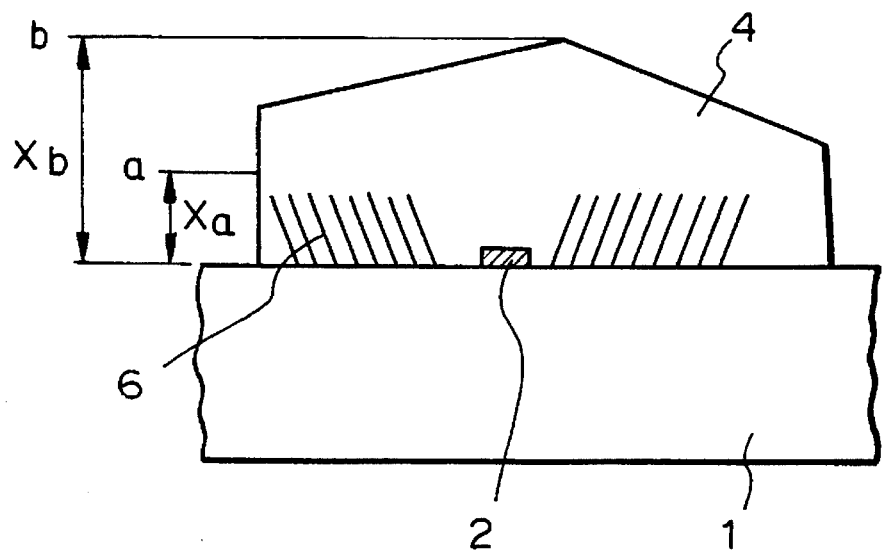
FIG. 5(A) is a schematic sectional view showing a crystal having crystal defects.

FIG. 5(A) is a schematic sectional view showing the crystal having crystal defects.

Figure 5B:
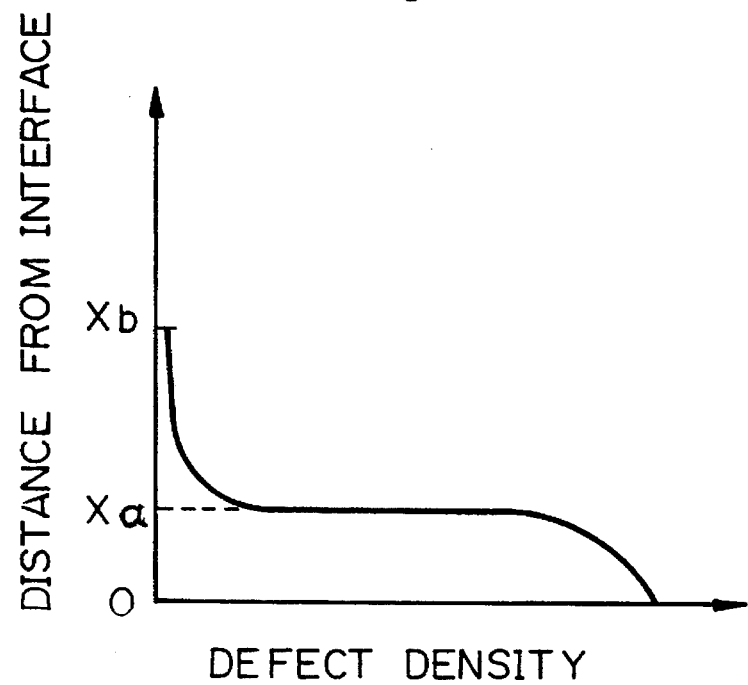
FIG. 5(B) is a graph in which the density of the above defects is measured versus the distance from the interface (axis of ordinate).

FIG. 5(B) is a graph in which the density of the above defects was measured versus the distance from the interface (axis of ordinate).

In FIG. 5(A), 6 shows crystal defects, and this may be considered to be attributable to the surface defect, coarsening, etc. of the surface of the substrate 1 of $SiO_2$, and these have extremely deleterious influences on various electrical characteristics in preparation of an electronic device.

From the interface between the single crystal 4 of Si and the substrate 1 to the upper position a of the single crystal 4, a group of defects is clustered, with the defect being extremely little in the upper position from a to b of the crystal, which is a good single crystal region. As shown in FIG. 5(A), the vertical distance $x_a$ corresponds to the distance between the crystal-substrate interface and position a and is approximately one-half the vertical distance $x_b$ that corresponds to the distance between the crystal-substrate interface and the uppermost point of the crystal. The tendency that crystal defects are concentrated at the lower portion and reduced toward the crystal upper portion is also observed in a heteroepitaxial growth of Si on a sapphire single crystal substrate.

The Si single crystal on the light-transmissive substrate having such defect localizing tendency is heated with a photoenergy beam such as a laser, a lamp, etc. from the back surface.

FIG. 6 is a graph showing the temperature distribution versus the distance from the interface during light irradiation (during annealing).

As shown in FIG. 6, the portion where crystal defects exist is melted by making the defect clustered portion from the interface between the single crystal 4 and the substrate 1 to the position a Tm (m.p. of Si of 1420° C.) or higher. Also, the irradiation conditions are controlled such that the good crystal region from the position a to the position b may be Tm or lower. By selecting the wavelength output of the light source, light absorption, light transmittance at the substrate or light absorption, depth at the Si single crystal can be controlled.

The crystal defect clustered region once melted will be thereafter recrystallized by cooling after light irradiation. During this process, since the upper crystal of good quality from the position to the position b is not melted, epitaxial growth proceeds from the upper part toward the interface, whereby crystal defects can be remarkably eliminated.

Figure 7A:
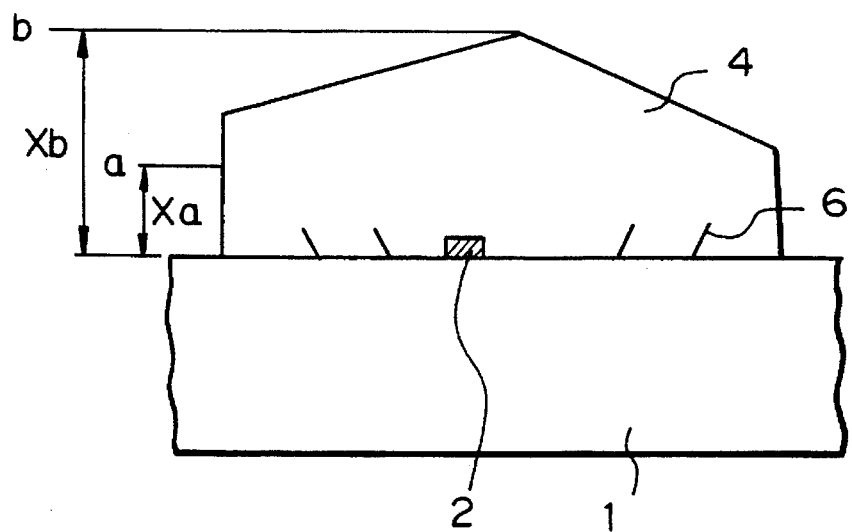
FIG. 7(A) is a schematic sectional view showing the crystal subjected to light irradiation in accordance with the present invention.

FIG. 7(A) is a schematic sectional view showing the crystal subjected to light irradiation according to the present invention.

Figure 7B:
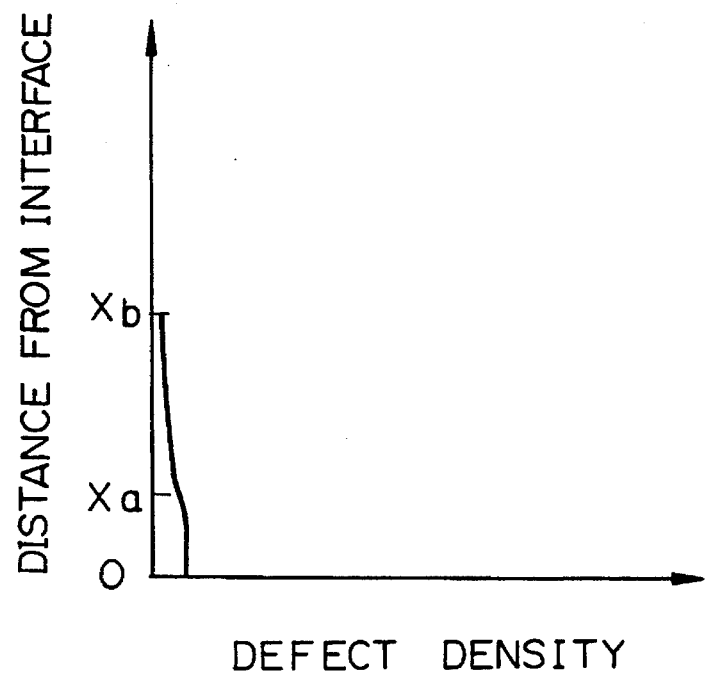
FIG. 7(B) is a graph in which the density of crystal defects is measured versus the distance from the interface (axis of ordinate).

FIG. 7(B) is a graph in which the density of crystal defects is measured versus the distance from the interface (axis of ordinate).

As shown in FIG. 7(A), the crystal defects 6 as shown in FIG. 5(A) are substantially extinguished, with the defect density being dramatically reduced in the vicinity of the interface from the interface to the position a as compared with before light irradiation as shown in FIG. 7(B), thus substantially enabling the crystal to become defectless, and the electronic device prepared from this single crystal is by far superior in electrical characteristics such as leak current, carrier mobility, etc. as compared with that prepared from a single crystal with much defects as shown in FIG. 5(A).

As described in detail above, according to the process for producing a crystal of the present invention, the crystal defects generated in the vicinity of the interface with the light-transmissive substrate can be reduced to a great extent, with the result that electrical characteristics of the electronic devices prepared using the crystal can be improved.

What is claimed is:

1. A process for producing a crystal comprising the steps of:

providing a light-transmissive substrate having two sides, one of said two sides providing a free surface including non-nucleation surface and a nucleation surface being arranged adjacent thereto, said nucleation surface having an area sufficiently small to effect growth of said crystal from a single nucleus, said nucleation surface being formed of an amorphous material having a nucleation density greater than a nucleation density of the non-nucleation surface;

applying vapor deposition to form said single nucleus only at said nucleation surface; and subjecting the other side of said substrate opposite to the side having the nucleation and non-nucleation surfaces to light irradiation to heat a region of the single crystal, said region having a vertical distance $X_a$ measured from an interface between the single crystal and said nucleation surface, to melt the crystal in the vicinity of said interface to thereby reduce crystal defects, such that $$X_a < \frac{X_b}{2},$$

wherein $X_b$ is a vertical distance measured from said interface to an uppermost point of the single crystal.

2. The process according to claim 1, wherein the step of light irradiation heats the single crystal formed on the substrate.

3. The process according to claim 1, wherein the step of light irradiation uses laser light.

4. The process according to claim 1, wherein the step of light irradiation uses lamp light.

5. The process according to claim 1, wherein the crystal is grown by the CVD method.

6. The process according to claim 1, wherein the crystal is grown by the vacuum vapor deposition method.

7. The process according to claim 1, wherein the substrate is glass.

8. The process according to claim 1, wherein the substrate is quartz.

9. The process according to claim 1, wherein the nucleation surface is a material having a composition different than the composition of the non-nucleation surface.

10. The process according to claim 1, wherein the nucleation surface is formed by ion implantation into the non-nucleation surface.

* * * * *

UNITED STATES PATENT AND TRADEMARK OFFICE
CERTIFICATE OF CORRECTION

PATENT NO. : 5,463,975

DATED : November 7, 1995

INVENTOR(S) : TAKAO YONEHARA

Page 1 of 5

It is certified that error appears in the above-identified patent and that said Letters Patent is hereby corrected as shown below:

COLUMN 1

Line 22, "take" should read --consider--; "in" should read --of--; "constant" should read --constants--; and "coefficient" should read --coefficients--.

Line 24, "layer, and there has been" should read --layer. Further,--.

Line 25, "involved the problem that" should be deleted and "the substrate material" should read --usable, substrate materials--.

Line 30, "done about" should read --conducted on--.

Line 33, "the direction" should read --a direction-- and "substrate, and also" should read --substrate. In addition,--.

Line 34, "about" should read --concerning--.

Line 35, "devices" should read --devices,--.

UNITED STATES PATENT AND TRADEMARK OFFICE
CERTIFICATE OF CORRECTION

PATENT NO. : 5,463,975

DATED : November 7, 1995

INVENTOR(S): TAKAO YONEHARA

It is certified that error appears in the above-identified patent and that said Letters Patent is hereby corrected as shown below:

Line 36, "etc." should read --etc.,--.

Line 38, "becoming more active" should read --increasing in activity--.

Line 39, "in these researches and developments," should read --to such research and development is developing a--.

Line 40, "the" should be deleted.

Line 41, "form" should read --to form--.

Line 42, "thereon is required." should read --thereon.--.

Line 43, "have" should read --developed--

Line 50, "was" should read --is--.

Line 54, "order, while" should read --order.--.

Line 55, "the" (first occurrence) should read --The--.

COLUMN 2

Line 11, "about" should be deleted.

UNITED STATES PATENT AND TRADEMARK OFFICE
CERTIFICATE OF CORRECTION

PATENT NO. : 5,463,975

DATED : November 7, 1995

INVENTOR(S): TAKAO YONEHARA

It is certified that error appears in the above-identified patent and that said Letters Patent is hereby corrected as shown below:

Line 14, "good" should read --a good--.

Line 15, "but" should be deleted.

Line 16, "case" should read --point--.

Line 18, "cause" should read --source--; "current" should read --currents--; and "trap" should read --traps--.

COLUMN 3

Line 10, "light-transimissive" should read --light-transmissive--.

Line 26, "description" should read --a discussion-- and "made" should read --provided--.

Line 63, "$4 \times 10^5$ $cm^{-2}$ should read --$4 \times 10^5$ $cm^{-2}$,--.

COLUMN 4

Line 4, "the" should read --a--.

Line 6, "into" should read --to--.

Line 30, "done" should read --accomplished--.

UNITED STATES PATENT AND TRADEMARK OFFICE
CERTIFICATE OF CORRECTION

PATENT NO. : 5,463,975

DATED : November 7, 1995

INVENTOR(S): TAKAO YONEHARA

Page 4 of 5

It is certified that error appears in the above-identified patent and that said Letters Patent is hereby corrected as shown below:

Line 48, "connection, since" should read --connection, since--.

COLUMN 5

Line 1, "excessively" should read --excessive--

Line 6, "kind" should read --kind of--.

Line 11, "shape" should read --the shape--.

Line 30, "current,trap" should read --current trap, --.

Line 34, "melting partially," should read --partially melting--.

Line 50, "used," should read --used.--.

COLUMN 6

Line 34, "As shown in" should be deleted.

Line 35, "Lines 35 to 38" should be deleted.

UNITED STATES PATENT AND TRADEMARK OFFICE
CERTIFICATE OF CORRECTION

PATENT NO. : 5,463,975

DATED : November 7, 1995

INVENTOR(S) : TAKAO YONEHARA

It is certified that error appears in the above-identified patent and that said Letters Patent is hereby corrected as shown below:

Line 41, "portion" (first occurrence) should read --crystal portion--.

Line 65, "position to" should read --position $\underline{a}$ to--.

COLUMN 7

Signed and Sealed this

Fourth Day of February, 1997

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,463,975

DATED : November 7, 1995

INVENTOR(S) : TAKAO YONEHARA

It is certified that error appears in the above-identified patent and that said Letters Patent is hereby corrected as shown below:

COLUMN 7

Line 26, "providing" should read --(a) providing--.
Line 32, after "nucleus", insert --such that any crystal deflects are (i) concentrated at a lower portion of said crystal in the vicinity of an interface between the substrate and the crystal and (ii) reduced in amount toward an upper portion of said crystal,--.
Line 36, "applying" should read --(b) applying--.

COLUMN 8

Line 1, "subjecting" should read --(c) subjecting--.
Lines 3-6, "a region of the single crystal, said region having a vertical distance $X_a$ measured from an interface between the single crystal and said nucleation surface" should read --said lower portion of said single crystal in which said crystal defects are concentrated--.

UNITED STATES PATENT AND TRADEMARK OFFICE
CERTIFICATE OF CORRECTION

PATENT NO. : 5,463, 975

DATED : November 7, 1995

INVENTOR(S): TAKAO YONEHARA

It is certified that error appears in the above-identified patent and that said Letters Patent is hereby corrected as shown below:

COLUMN 8 (CONTINUED)

Lines 7-14, "such that $X_a < X_b/2$, wherein $X_b$ is a vertical distance measured from said interface to an uppermost point of the single crystal" should read --whereby said lower portion is recrystallized upon cooling and epitaxial growth occurs in said lower portion--.

Signed and Sealed this

Ninth Day of December, 1997

Attest:

*Attesting Officer*

BRUCE LEHMAN

*Commissioner of Patents and Trademarks*